United States Patent [19]

Gregory

[11] Patent Number: 4,584,767
[45] Date of Patent: Apr. 29, 1986

[54] IN-MOLD PROCESS FOR FABRICATION OF MOLDED PLASTIC PRINTED CIRCUIT BOARDS

[76] Inventor: Vernon C. Gregory, 239 W. Myrna La., Tempe, Ariz. 85284

[21] Appl. No.: 631,209

[22] Filed: Jul. 16, 1984

[51] Int. Cl.⁴ ............................................. H01K 3/22
[52] U.S. Cl. ......................................... 29/848; 29/846; 174/68.5
[58] Field of Search .......................... 29/848, 874, 849; 174/68.5; 264/272.15, 272.17, 273

[56] References Cited

U.S. PATENT DOCUMENTS

| | | | |
|---|---|---|---|
| 2,772,501 | 12/1956 | Malcolm | 29/849 X |
| 2,861,911 | 11/1958 | Martin et al. | 29/849 X |
| 2,971,249 | 2/1961 | Anderson et al. | 174/68.5 X |
| 2,972,003 | 2/1961 | Greenman et al. | 361/411 X |
| 2,986,804 | 6/1961 | Greenman et al. | 29/852 |
| 3,077,658 | 2/1963 | Wharton | 174/68.5 X |
| 3,161,945 | 12/1964 | Anderson et al. | 29/848 |
| 3,499,220 | 3/1970 | Hintz et al. | 174/68.5 X |
| 3,889,363 | 6/1975 | Davis | 29/848 |
| 4,411,982 | 10/1983 | Shibuya et al. | 29/846 X |

Primary Examiner—Howard N. Goldberg
Assistant Examiner—Carl J. Arbes
Attorney, Agent, or Firm—Ostrolenk, Faber, Gerb & Soffen

[57] ABSTRACT

A molding process and resulting product is disclosed in which a printed circuit pattern carrier is placed in a mold and is molded to an insulation carrier. The insulation carrier is disclosed as a printed circuit board or the interior of the insulation housing for an electrical product. Plural laminations molded atop one another are disclosed. The printed circuit carrier has mold gate openings to enable molding of features which extend above the plane of the conductive layer. A printed circuit pattern is applied before the molding step.

17 Claims, 18 Drawing Figures

FIG. 5. MOLD HALF (COLD SIDE)

FIG. 6. MOLD HALF (HOT SIDE)

IN-MOLD PROCESS FOR FABRICATION OF MOLDED PLASTIC PRINTED CIRCUIT BOARDS

BACKGROUND OF THE INVENTION

This invention relates to printed circuit boards, and more specifically relates to a novel structure of a printed circuit board and novel method for its fabrication.

Printed circuit boards are well known in the art. Conventional printed circuit boards consist of flat laminates, for example, of a phenolic which has a conductive pattern formed thereon. The conductive pattern usually consists of a copper foil which is adhesively secured to the surface of the phenolic board, with sections of the foil removed as by etching in a photolithographic process to define the desired conductive pattern. The board is also machined, drilled or punched to provide the necessary openings through the board to provide for mounting and for passage of conductors from one side of the board to the other. The presently used conventional process is expensive since it requires numerous steps which are separately performed on individual boards.

Molded circuit boards are known wherein a thermosetting or thermoplastic material is molded by any traditional molding technique. A copper foil is then adhesively secured to the top of the molded body and is patterned to define the desired conductive traces. It is known that during the molding, desired openings or other surface features can be directly formed on the molded circuit board.

Presently existing molding systems, like the conventional circuit board employing a phenolic base, require numerous manufacturing steps and numerous steps in the application of the circuit patterns, although some expense is saved by the ability to form openings in the molded body during the molding process. Molded circuit boards, however, are still expensive and have experienced poor bonding between the conductive patterns and the molded board.

BRIEF DESCRIPTION OF THE INVENTION

The present invention provides a novel process for the manufacture of a molded circuit board in which the circuit board is completely formed within the mold during the molding process. The system also lends itself to continuous manufacturing techniques and produces novel circuit board configurations. The present invention also makes it possible to form printed circuit patterns directly in the body of the molded housing of apparatus such as telephone receivers or solid state relays or other bodies having insulation housings.

In accordance with the present invention, a conductive foil, preferably backed with a thermoplastic backing, is located within the molding cavity of an injection mold or other equivalent molding apparatus. Preferably, the thermoplastic backing faces the portion of the cavity which receives the bulk of the plastic molding compound. When plastic is then injected into the mold cavity, it adheres to the thermoplastic backing, care being taken to ensure that the plastic backing of the copper foil will strongly adhere to the material being injected into the mold. Openings may also be formed in the foil or laminate of foil and backing to enable the formation of surface features of the injected plastic material which will project above the plane of the conductive foil.

While the above concept contemplates the molding of generally flat molded circuit boards, it will be apparent that the concept of the invention can also be employed for the molding of more complicated three-dimensional molded objects such as the body of a telephone handset or the body of the insulation cover of a wall box type dimmer or a solid state relay. In this manner, conductive traces can be formed directly on the interior of the insulation housing of a three-dimensional object to enable the mounting and interconnection of control circuit components therein to eliminate or substantially eliminate the need for conventional flat circuit boards in the apparatus in question.

The process of the invention is capable of a continuous manufacturing process in which the conductive film or laminate is an elongated continuous web which is stepped through a molding apparatus and other appropriate processing stages. The completed web can then be separated into its components or can be moved to a subsequent assembly stage while still in the web state, with the web elements separated only after electrical components are mounted on the printed circuit patterns.

By using the molding process of the invention, the ultimate product will be in its finished form and will not require subsequent routing, punching, drilling or other secondary operations. Moreover, the substrate may contain all desired three-dimensional features such as standoffs, connector bodies, mounting bosses, snap-fits and other features which eliminate secondary parts and operations. As stated above, in the ultimate expression of the concept of the present invention, the circuit board per se will disappear with the circuitry being formed on the structure of the product such as the interior of a telephone hand set housing or solid state relay housing.

In the formation of protruding features above the surface of the conductive layer, it is only necessary to provide a gate or opening in the foil to allow molten resin to flow through the plane of the foil and into a suitable molding cavity feature. As further features of the invention, the foil may be slit, pierced or formed in other ways so that the plane of the conductive circuitry is changed in whole or in part by bending or folding the foil.

It is also possible to employ multiple film laminates bonded to one another, thereby to define spaced conductive patterns which may cooperate with one another in any desired manner.

In the manufacturing process, it is possible to form a photolithographic pattern on the conductive foil before the molding process. Photoresists are known which will resist the temperatures of the molding operation so that, after the molding operation, the conductive patterns can be etched as desired. If desired, the individual circuit boards can also be separated from one another by an etching process.

As will be later described, it is a primary object of this invention to manufacture a circuit substrate with one or more conductive planes by employing a molding technique such as injection molding, transfer molding, compression molding or the like within the tool of a molding machine.

Another object of this invention is to place a suitable metallic foil into the molding cavity of a molding apparatus and to thereafter mold a plastic body onto or, in part, around or through the foil, to form the substrate of the circuit and/or the body of a product embodying the circuit.

Another object of this invention is to form a multiplanar molding circuit board.

Another object of this invention is to load a foil consisting of a conductive layer and a thermoplastic layer into a mold cavity and to inject a plastic resin of material characterized in adhering to the plastic layer into the cavity to define a printed circuit board.

Another object of this invention is to bond or print a photoresist on a copper foil to define a given conductive pattern and to thereafter place the patterned foil into a mold cavity for the bonding thereto of a plastic substrate without destroying the photoresist pattern.

Another object of this invention is to provide a novel process for manufacture of a printed circuit board in which a conductive foil is indexed through an injection molding apparatus.

Another object of this invention is to continuously etch given circuit patterns onto an elongated web of conductive foil and thereafter to step the individual circuit patterns through a molding machine to form identical molded circuit boards.

Another object of this invention is to form a novel printed circuit board manufactured in a continuous stepping process which contains three-dimensional features, including features extending above the conductive plane.

Another object of this invention is to provide a novel process for manufacture of printed circuit boards in a continuous process wherein the circuitry plane is altered by piercing, slitting, bending, folding and other mechanical operations on the foil which is employed.

Another object of this invention is to provide an inexpensive printed circuit board.

Still another object of this invention is to provide a novel means for applying a printed circuit pattern in the interior of a three-dimensional insulation housing.

These and other objects of the invention will become apparent from the following detailed description of the drawings.

BRIEF DESCRIPTION OF THE DRAWINGS

FIG. 2 shows the foil of FIG. 1 with an adhesive for the bonding function.

FIG. 3 is a plan view of the foil of FIG. 1, wherein FIG. 1 is a section view of FIG. 3 taken across the section line 1—1 in FIG. 3.

DETAILED DESCRIPTION OF THE DRAWINGS

Figure 1:
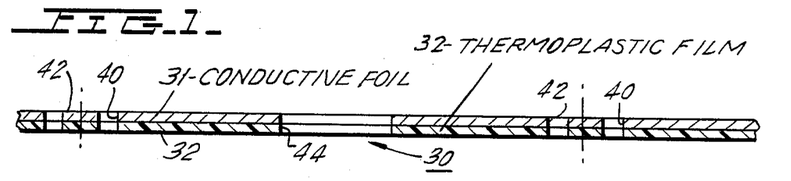
FIG. 1 shows a foil of a conductive material bonded to a thermoplastic substrate.

Referring first to FIG. 1, there is shown a conductive foil 30 which consists of an upper conductive layer 31 and a lower insulation layer 32. The foil 30 is a flexible foil of any desired length, which can be wound on a reel.

Conductive layer 31 may be of any desired type, typically a conventional copper foil having a thickness of 1.4 mils., and having a brass matte lower surface which more tenaciously bonds to an insulation body than an unprepared copper surface. Other thicknesses can be used. Layer 31 can also be of other conductive materials of any desired type and can be plated with materials such as tin, lead, nickel, and gold, alone or in various combinations, as is conventional in the printed circuit art.

Layer 32 can be of any desired insulation material but preferably is a thermoplastic film which will bond easily to an identical or to similar thermoplastic materials. Layer 32 may be a thermoplastic having a thickness from 1-5 mils., preferably 3 mils. By way of example, layer 32 may be a polyetherimide, which is a thermoplastic resin manufactured by the General Electric Company under their trademark Ultem. Ultem resin is the preferred material and bonds well to conductive foils. The use of Ultem resin as the substrate is desirable for molding in a hot mold and produces a glass-free surface with minimum distortion and molded-in stress. Thus, the Ultem resin material is ideally applicable to injection molding processes at 650° F. in which a mold is preheated to about 300° F. Such molds can be opened and a part ejected about three times per minute without damage.

Other known materials can be used for the plastic layer 32. These include "Udel", polysulfone, manufactured by Union Carbide; polyarylsulfone, manufactured by Union Carbide; "Victrex", polyethersulfone, manufactured by ICI America; and "Ryton", polyphenylene sulfide, manufactured by Phillips.

Laminated foils of the type shown in FIG. 1 consisting of copper and Ultem resin layers are commercially available from Rodgers Corporation and is the preferred laminate for use with the invention.

Figures 2, 3:
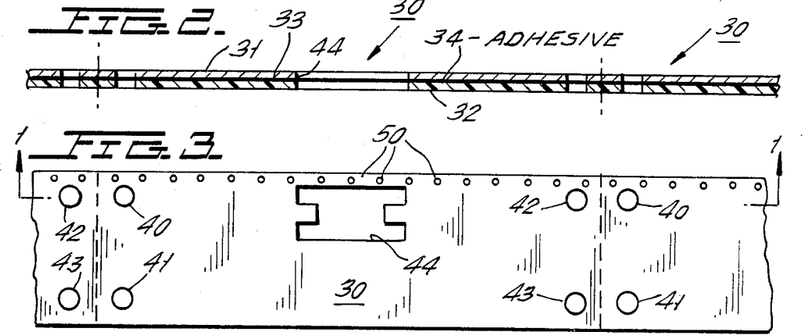

A laminate is also shown in FIG. 2 which is formed of a conductive foil 31 and plastic film 32 where the two are connected together by a suitable adhesive layer 33. The adhesive 33 can consist, for example, of the adhesive "Pliobond" 30 manufactured by Goodyear.

FIG. 3 shows a plan view of the web of FIG. 1 and FIG. 2. As shown in FIG. 3, the web is continuous and can have any desired width, for example 1 inch, depending on the circuit board design to be employed. The web can have numerous openings formed therein. For example, in FIG. 3 the laminate 30 has openings 40, 41, 42 and 43 therein which serve to receive mold registration pins, as will be later described. A further opening 44, which will later be seen to serve as gate opening to form a surface feature on the printed circuit board, is also provided. These openings are stamped in the web in a suitable manufacturing step, using conventional die structures, before the insertion of the web into the mold. Also formed in the web are a series of openings such as openings 50 along one edge of the web which may serve to receive sprocket gears of a timing and drive means for timing the movement of the web during the manufacturing process. Photo-readable marks can also be used.

Figure 9:
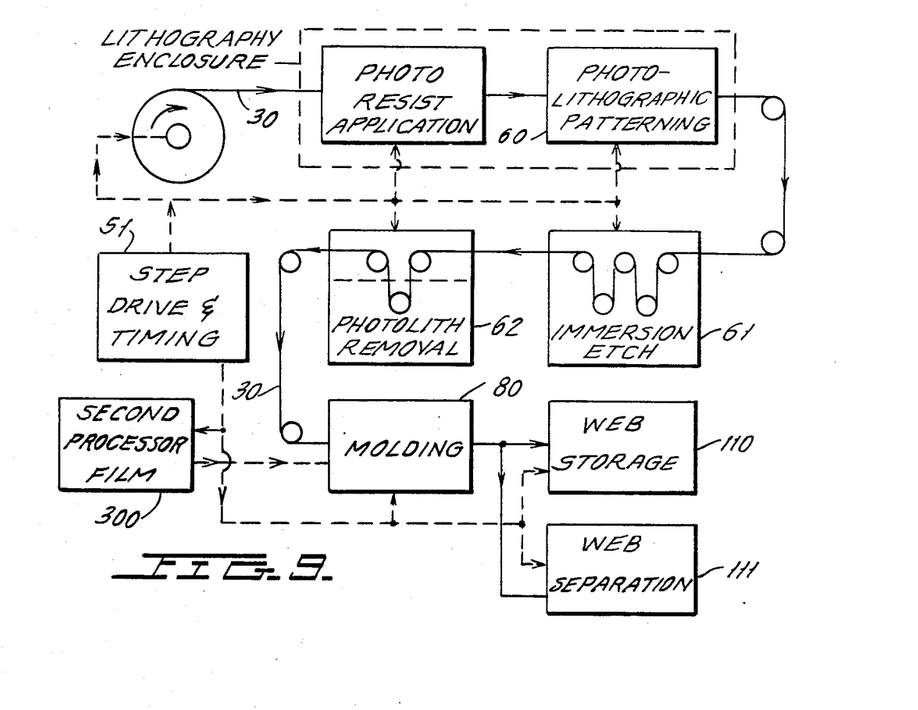
FIG. 9 schematically illustrates, in block diagram form, a process for the manufacture of the web and circuit board of FIGS. 7 and 8.

As is best shown in FIG. 9, the web 30 may be wound in reel form and can be driven by a suitable stepping drive and timing mechanism 51 which may include a stepping motor and timing circuit which advances the web 30 a predetermined distance in a predetermined time. By way of example, the web can be advanced through the manufacturing process by 3 inches every 20 seconds for circuit boards 3 inches in length.

The foil 30 is first introduced into a photoresist application means in FIG. 9 where a suitable photoresist is applied to its upper surface. A dry photoresist film can be bonded to the copper surface of layer 31 (FIG. 1), employing one of a family of materials such as Riston, manufactured by DuPont. This material can be bonded to the copper foil and the circuit image can be imposed before the foil is inserted into the molding tool. This photoresist is capable of withstanding the heat and pressure during the molding operation so that pattern etching need not take place until after the molding operation is completed. By pre-bonding and pre-exposing the photolithographic image onto the film prior to the molding operation, any protruding features, which are to be later formed on the substrate, will not interfere with the development of the desired pattern. Clearly, conventional photoresist materials, including liquids, pastes, inks, polymers, slurries and the like, can be printed onto the copper foil 31 as shown in FIG. 9. The photoresist application and further photoresist patterning which follows is carried out in a conventional lithography enclosure which filters out ultraviolet light from the ambient light.

A suitable pattern is then formed in the photolithographic patterning stage 60 (FIG. 9), on the web segment which is to be treated. Ultem resin is resistant to ferric chloride and other etchants normally used in the fabrication of the pattern on a printed circuit board. Consequently, if the continuous web of material 30 leaving the molding machine, as will be later described, employs an Ultem resin layer 32, the web can pass immediately into an etching machine to develop the image exposed to the photoresist and etch away the unwanted copper, leaving a completed web of circuit boards linked together by plastic backing.

Thus, in FIG. 9, after the web 30 leaves the patterning stage 60, it enters an etch stage 61 in which the etch travels through an immersion tank of a suitable etching material which removes all of the copper exposed through the photolithographic pattern. Note that the materials used for the immersion etch and photolithographic removal stages 61, 62 will take into account the dwell time of the materials in the fluid as determined by the step drive and timing mechanism 51. The length of time the web is exposed to the etching fluids can be adjusted as necessary.

Figure 4:
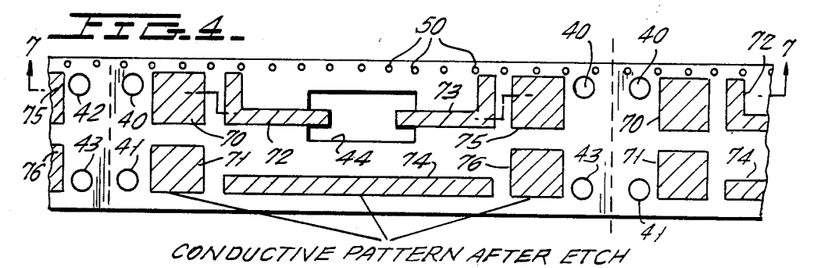
FIG. 4 shows the foil of FIG. 3 after a photolithographic etching operation is performed to define the conductive pattern, shown in cross-hatching.

FIG. 4 shows one typical pattern which could remain after the etching operation. In FIG. 4, spaced conductive patterns 70-76 are formed for each of the web sections. Obviously, any other desired circuit pattern could be employed.

After the conductive patterns 70-76 are formed, the web 30 may be passed through an appropriate stripping stage 62 in FIG. 9, which strips the protective photolithographic layer off of the copper pattern. Any conventional photolithographic stripping medium can be used.

Figure 5:
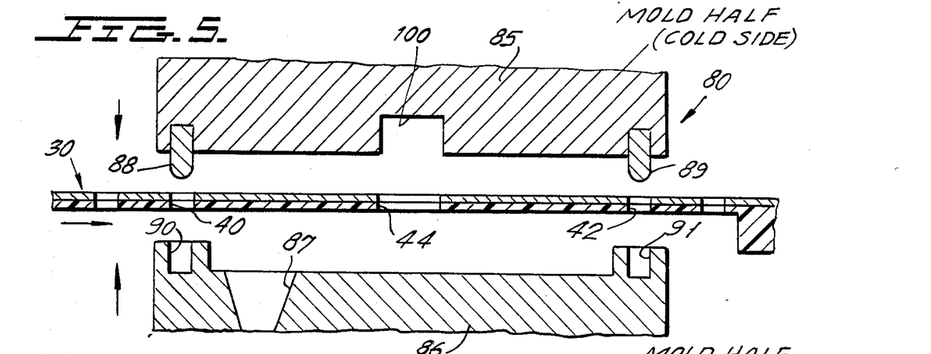
FIG. 5 shows the mold halves into which the foil of FIG. 1 is introduced, in accordance with the present invention, with the mold halves open.
Figure 6:
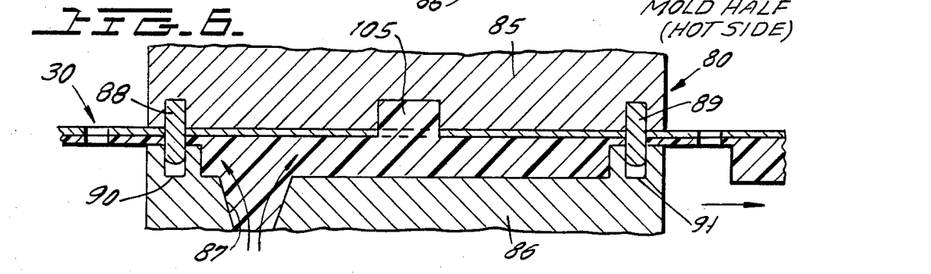
FIG. 6 shows the mold of FIG. 5 with the mold halves closed and a thermoplastic resin injected into the cavity formed by the closed mold halves.

The foil or web 30 is thereafter moved to the molding stage 80 in FIG. 9. The molding stage 80 is best shown in FIGS. 5 and 6 for an injection molding process of a thermoplastic resin such as the Ultem or some other resin which will adhere to the resin forming the layer 32 of the web 30. The mold in FIGS. 5 and 6 consists of a cold mold-half side 85 and a hot mold-half side 86. The mold is a conventional injection molding apparatus having a mold gate 87, with registration pins 88 and 89 in mold-half 85 registering with registration pin openings 90, 91, respectively, in the hot mold-half 86. A second set of pins 88, 89 and openings 90, 91 are symmetrically disposed on the rear side of the mold halves 85 and 86 so that the pins 88, 89 and two other pins (not shown) will register with openings 40, 42 and 41, 43 in the web 30.

Mold-half 85 has a rectangular depression 100 at a central location corresponding to the opening 44 in the web 30. Consequently, when the mold is closed, as shown in FIG. 6, and resin is injected through the opening 87, the molten resin will flow into the main cavity formed and through the opening 44 into depression 100 to form an upper surface feature 105 which projects above the plane of the conductive surface of layer 31. Other mold openings, suitably placed, can form other surface features of any desired type in both the upper and lower surfaces of the printed circuit board to allow for assembly of components, insulation barriers, mounting legs and the like.

The mold-halves may be preheated to 300° F. and the plastic, preferably Ultem resin, is injected at 650° F. The mold closure resin injection and cooling time is about twenty seconds for each operation when molding a backing having a thickness of about 0.62 inch. Thus after twenty seconds the mold is opened and the web 30 is indexed to the right to place a new web section between the open mold-halves and the molding cycle is continued. Those products which have been molded are indexed either into a web storage area 110, shown in FIG. 9, or can be separated at a web separation stage 111 for further processing. It is possible also to move the web into a circuit board assembly region where, while the circuit boards are still joined together by the conductive foil 30, the various printed circuit components can be mounted and interconnected in automatic or semi-automatic assembling equipment. The circuit boards can then later be separted from one another after full assembly of the circuit board.

The etching process described above can employ other etching techniques and, for example, can use time coordinated sprays to coordinate travel time through the mold with the exposure times required in the various etching process steps.

Figure 7:
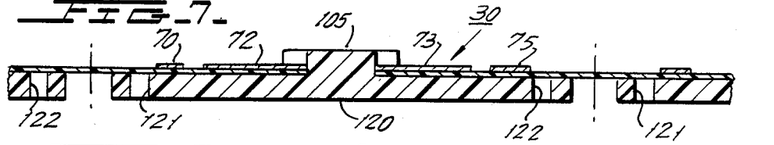
FIG. 7 shows a web of circuit boards which is defined by the molding operation as shown in section 7—7 in FIG. 4.

FIG. 7 shows the final web. It will be understood that the thicknesses of the web in FIG. 7 and in other figures are greatly exaggerated for clarity. By way of example, the thickness of the molded resin body can be about 62 mils., whereas the total thickness of the foil may be about 4 mils. The molded body of resin, which is formed in the mold cavity of FIGS. 5 and 6, is the generally flat body 120. The mold body may have surface projections (not shown) to enable the formation of through openings 121 and 122 which can act as mounting openings for mounting the assembled circuit board. Note also the projecting section 105 which projects above the level of the conductive foil 30.

Figure 8:
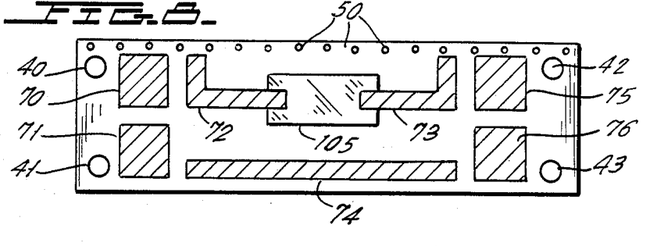
FIG. 8 is a plan view of a single circuit board cut from the web of FIG. 7.

FIG. 8 shows a single one of the boards separated from the web of FIG. 7 in plan view where components having numerals similar to those of the preceding figures identify identical elements.

In the above descriptions of the drawings, the resin injected in the molding apparatus will adhere to a similar or identical plastic web secured to the copper foil. It is also possible, when employing resins and appropriately treated copper foil to use simply a copper web foil without a laminated thermoplastic resin and to obtain appropriate adhesion. Thus, materials such as Ultem, which are injected into the mold cavity, will adhere to the brass matte surface of a copper foil which is loaded into the mold as described. It has been found that plastic can also be molded directly onto a bare copper foil which is coated with a "B" stage adhesive since the injected plastic transfers sufficient heat and pressure to the adhesive to obtain good adherence between the foil and the injected plastic.

Figure 10:
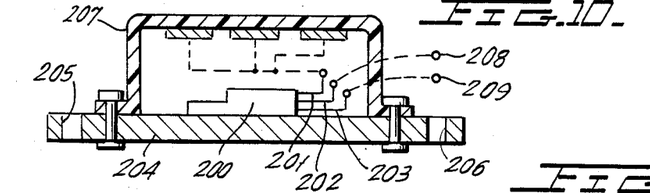
FIG. 10 illustrates an electrical component having a molded housing wherein the control circuit for controlling the operation of the device may be mounted on a conductive pattern molded into the interior of the housing.
Figure 11:
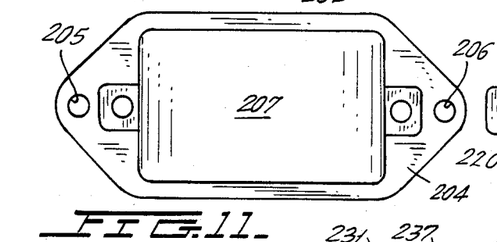
FIG. 11 is a top plan view of FIG. 10.

While the above describes the invention in connection with the formation of generally flat molded circuit boards which have protruding surface features, it is also possible to use the invention to form a printed circuit pattern directly in the interior of a three-dimensional plastic housing for enclosing electrical apparatus. Thus, an electrical device is shown in FIG. 10 which consists, for example, of a thyristor contained in TO-220 style package having leads 201, 202 and 203 extending therefrom. The package 200 is mounted on a conductive heat sink 204 which has mounting bolt openings 205, 206 of conventional form. Lead 201 may be a control lead applied to the gate of the power switching device 200 while leads 202, 203 may be the main power leads which are taken out through the plastic enclosing housing 207 as schematically illustrated in dotted lines leading to the output terminals 208, 209 in FIG. 10. In order to control the switching of the device 200 in accordance with some predetermined pattern, as is common for commercial solid state relays which might use zero cross firing and the like, it is necessary to have a control circuit which is commonly mounted on a printed circuit card. In accordance with the present invention, instead of a separate printed circuit card, the printed circuit pattern is formed on a web of the type shown in FIG. 4. During the molding of the insulation cap 207, the prepatterned web 30 of FIG. 4 is clamped into the mold used to form the cap 207 and is integrally molded with the three-dimensional cup-shaped insulation cover 207.

Figure 12:
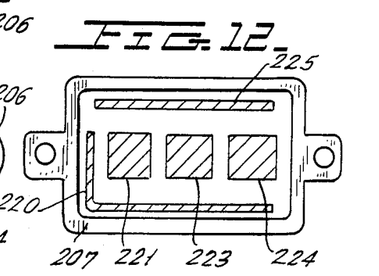
FIG. 12 is a view of the interior of the housing of FIG. 10 and particularly illustrates the circuit pattern which is molded therein.

A typical conductive pattern which could be used is that shown in FIG. 12 which shows the interior of the housing 207 and contains the conductive patterns 220-225. The control circuit components which are to be carried on the printed patterns 220-225 may then be subassembled in place. When the cap 207 is closed onto the base 204, the leads from the control circuit to the leads 201-203 are connected in place by relatively long flexible wires or by an appropriate electrical connection accomplished when the housing 207 is closed down on to the surface 204. For example, conductive patterns (not shown) can extend along the sides of the interior of housing 207 to make connection with flexible spring fingers (not shown) extending from the respective leads 201, 202 and 203. Thus, the concept of the present invention can be employed to eliminate conventional circuit boards now used in the interior of electrical equipment employing three-dimensional insulation covers. Such applications would include placing the conductive patterns of the printed circuit board on the interior surfaces of the housing of a solid state relay or telephone handset or the like, thus leading to a simplification and reduced cost for those articles.

Figure 13:
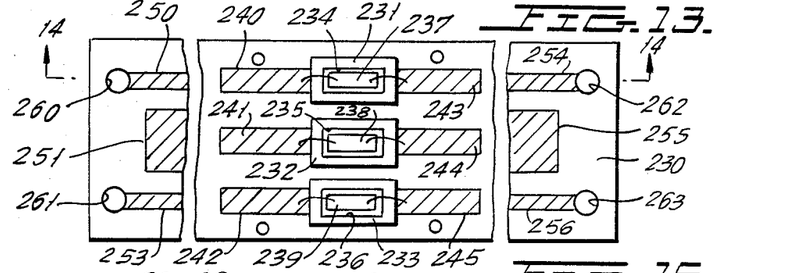
FIG. 13 is a plan view of another embodiment of a molded circuit board manufactured in accordance with the present invention wherein molded depressions are provided for receipt of semiconductor chips.
Figure 14:
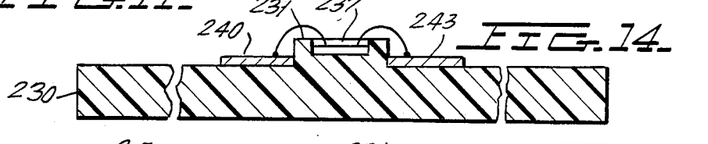
FIG. 14 is a cross-sectional view of FIG. 13 taken across the section line 14—14 in FIG. 13.

FIGS. 13 and 14 show a printed circuit board which is molded in accordance with the present invention and includes novel mold features which are raised above the conductor level. Thus, in FIGS. 13 and 14, the board 230 is molded as described in connection with FIGS. 5 and 6 and is a part of a continuous web of identical boards. As best shown in FIG. 13, the mold has three surface projections 231, 232 and 233 which contain respective wells 234, 235 and 236. These wells support semiconductor chips 237, 238 and 239, respectively, which fit with relative loose tolerance within the wells 234, 235 and 236, respectively, to substantially simplify the handling and loading of the chips into the printed circuit board. The board next includes conductive surface patterns such as the patterns 243, 245 which extend in pairs from the opposite sides of each of the projections 231, 232 and 233. Wire bond connections can then be made from electrodes on the chips 237, 238 and 239 to the adjacent conductive patterns of patterns 240-245, as shown. Other conductive patterns, including patterns 250, 251, 253, 254, 255 and 256, can also be provided on the board or foil for other circuit applications. Note, for example, that patterns 250, 253, 254 and 256 can lead to eyelet regions 260, 261, 262 and 263, respectively, which can serve as terminal regions for the circuit which is to be formed. Obviously, any other desired conductive circuit pattern could be formed on the board 230 of FIGS. 13 and 14 and other desired surface features could also have been employed by appropriate modification of the mold halves 85 and 86 of FIGS. 5 and 6.

Figure 15:
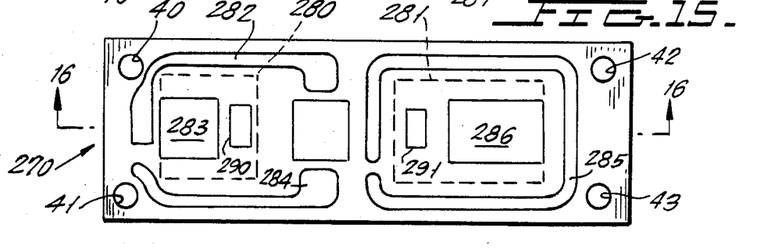
FIG. 15 is a plan view of another embodiment of a circuit board constructed in accordance with the present invention wherein there are two parallel conductive layers on the board.
Figure 16:
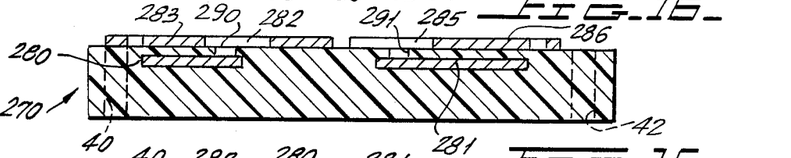
FIG. 16 is a cross-sectional view of FIG. 15 taken across the section line 16—16 in FIG. 15.

As previously stated, the present invention makes it possible to have several planes of conductive patterns in a printed circuit board. This application is illustrated in FIGS. 15 and 16, wherein a molded printed circuit board 270 is formed of two layers of foil 30 laminated atop one another but having different respective conductive patterns on their copper foils 31, respectively. These two foils are schematically illustrated in FIG. 16 as having different conductive patterns which partly overlap one another. Thus, the lower conductive pattern of the lower foil may consist simply of rectangular patterns 280, 281 while the upper foil contains the patterns 282–286. Note, for example, that the patterns 280 and 283 overlap and, similarly, patterns 281 and 286 overlap, so that they might define the spaced plates of respective capacitors. Electrical connection can be made to the buried layers 280, 281 through the openings 290 and 291, which are formed in the uppermost of the two foils.

The laminated arrangement of FIGS. 15 and 16 may be formed as shown in FIG. 9 simply by introducing the second processed film from a stage 300 in FIG. 9 into the mold, where the film has been processed in a manner similar to that of the film 30. Film 30 is the uppermost of the films introduced into the mold and will have its own unique conductive pattern selected by the designer.

Figure 17:
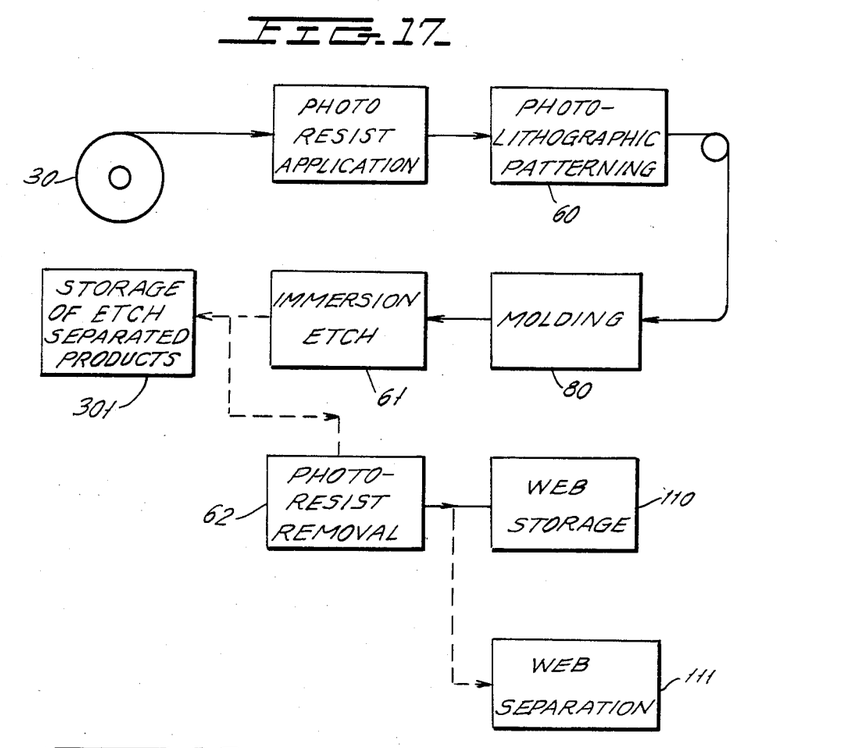
FIG. 17 is a process diagram similar to that of FIG. 9 wherein photoresist etching occurs after the molding operation.

FIG. 17 shows a modified process which can be employed in accordance with the present invention and differs from that of FIG. 9 in that the pattern formed on the substrate is etched after the molding stage. Thus, in FIG. 17 the web 30 moves through the photoresist application stage and then the photolithographic patterning stage 60, as in the case of FIG. 9. Thereafter, however, the web moves directly into the molding stage 80. Thereafter, the molded circuit board goes into the immersion etch stage 61 and can then either be directly stored in the storage area 110 or can move to the photoresist removal stage 62 and then to web storage of etch-separated products 301 or web separation stage 111, as in FIG. 9.

Figure 18:
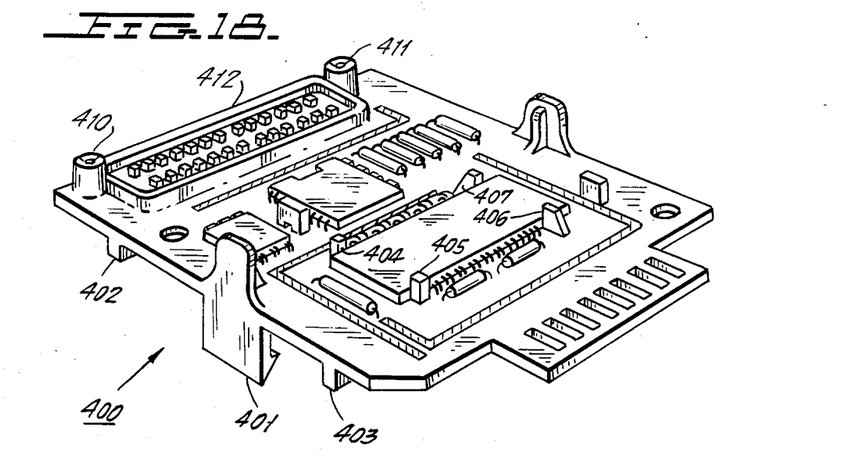
FIG. 18 is a perspective view of a circuit board containing numerous surface features and which could contain a conductive pattern molded in accordance with the present invention.

Any desired number of surface features can be formed during the molding process. By way of example, the circuit board can have the configuration schematically illustrated in FIG. 18 for the board 400. Thus, the board may have features such as latching tabs 401, reinforcing ridges 402, 403, component locating projections 404–407, elongated mounted screw openings 410, 411, contact enclosing ridges 412 and the like. During the molding of these features, however, a film or laminate 30 is fixed within the mold and has suitable openings to enable the formation of the projection features which project above the surface of the conductive film as previously described.

Although the present invention has been described in connection with preferred embodiments thereof, many variations and modifications will now become apparent to those skilled in the art. It is preferred, therefore, that the present invention be limited not by the specific disclosure herein, but only by the appended claims.

What is claimed is:

1. An in-mold process for the fabrication of a molded plastic printed circuit board comprising the steps of forming at least one enclosed opening of given shape through a thin conductor foil; and thereafter inserting said thin conductor foil between the open first and second halves of a mold with a conductive first surface of said foil in abutting contact with the interior surface of said first half of said mold and aligning said enclosed opening in said foil with a related depression in said interior surface of said first mold half, closing said first and second mold halves and forming an enlarged sealed volume between the interior of said second mold half and the surface of said foil opposite said first surface; said enlarged volume communicating with said enclosed opening; injecting a molten plastic resin into said volume to fill said volume and said depression, and cooling said molten plastic resin, with said resin firmly adhering to said foil, thereby to define a molded printed circuit board having a body of said resin, and said conductor foil secured to the surface of said body of said resin.

2. The process of claim 1 which further includes the step of applying a patterned photoresist atop said first surface of said foil before inserting said foil in said open mold halves.

3. The process of claim 2, wherein said conductor foil is etched away from areas exposed by said photoresist before said foil is inserted in said open mold-half.

4. The process of claim 2, wherein said conductor foil is etched away from areas exposed by said photoresist after said molded printed circuit board is released from said mold-half.

5. The process of claim 1, 2, 3 or 4, wherein said conductor foil is a laminate of a copper foil lamination extending to said first surface and a plastic resin lamination extending to said opposite surface; said plastic resin lamination having the characteristic of adhering strongly to said resin which fills said enlarged volume.

6. The process of claim 5, wherein said printed circuit board has a thickness of less than about 0.100 inch and wherein said conductor foil has a thickness of less than about 0.010 inch.

7. An in-mold process for the fabrication of a printed circuit pattern on an insulation body, comprising the steps of providing a conductor foil carried on a strip of plastic laminate and constituting a plurality of separate portions arranged along the length of said strip and inserting said conductor foil between the open first and second halves of a plastic mold with a conductive first surface of said foil in abutting contact with a surface portion of said first half of said mold; closing said first and second mold halves and forming a sealed volume in the configuration of a cup-shaped enclosure for an electrical component and extending from the surface of said foil opposite said first surface and wherein said enclosure configuration is oriented such that a separate portion of said conductor foil is disposed adjacent an interior surface of said enclosure configuration; injecting a molten plastic resin into said volume to fill said volume, and cooling said molten plastic resin with said resin firmly adhering to said foil; whereby said printed circuit pattern is formed on the interior surface of the insulation enclosure.

8. The process of claim 7 which further includes the step of applying a photoresist atop said copper foil with a given pattern atop said first surface of said copper foil before inserting said copper foil in said open mold-halves.

9. The process of claim 8, wherein said copper foil is etched away from areas exposed by said photoresist before said conductor foil is inserted in said open mold.

10. The process of claim 8, wherein said copper foil is etched away from areas exposed by said photoresist after said molded printed circuit board is released from said mold.

11. The process of claim 7, wherein said printed circuit board has a thickness of less than about 0.100 inch and wherein said conductor foil has a thickness of less than about 0.010 inch.

12. An in-mold process for the continuous fabrication of printed circuit boards comprising the steps of forming a plurality of enclosed openings along the length of an elongated web of a conductor foil; and then inserting a given length of the web of conductor foil between the open first and second halves of a mold for plastic materials with a conductor first surface of said foil in abutting contact with the interior surface portion of said first half of said mold and aligning a respective one of said enclosed openings in said web of conductor foil with a related depression in said interior surface of said first mold half; closing said first and second mold halves and forming an empty sealed volume of given geometric shape extending from the surface of said foil opposite said first surface; and injecting a molten plastic resin into said volume to fill said volume, and cooling said molten plastic resin with said resin firmly adhering to said foil, thereby to define printed circuit pattern consisting of said conductor foil atop one surface of said body of said resin with a portion of said body of said resin projecting upwardly through said respective enclosed opening of the foil; opening said first and second mold halves, and advancing said web to insert a new web portion of said given length between said open first and second halves of said mold, and repeating said steps for forming a second printed circuit pattern atop a second body of said resin, and continuing to open said mold and advancing said web, and molding a new resin body in a continuous fashion.

13. The process of claim 12, wherein said conductor foil is a laminate of a copper foil lamination extending to said first surface and a plastic resin lamination extending to said opposite surface; said plastic resin lamination having the characteristic of adhering strongly to said resin which fills said volume.

14. The process of claim 13 which includes the steps of applying a photoresist atop said copper foil with a given pattern atop said first surface of said copper foil before inserting said conductor foil in said open mold-halves.

15. The process of claim 14, wherein portions of said copper foil are etched away from areas exposed by said photoresist before said conductor foil is inserted in said open mold.

16. The process of claim 14, wherein portions of said copper foil are etched away from areas exposed by said photoresist after said molded printed circuit board is released from said mold.

17. The process of claim 13, wherein said printed circuit board has a thickness of less than about 0.100 inch and wherein said conductor foil has a thickness of less than about 0.010 inch.

* * * * *